United States Patent
Ying et al.

(10) Patent No.: US 6,436,838 B1
(45) Date of Patent: Aug. 20, 2002

(54) METHOD OF PATTERNING LEAD ZIRCONIUM TITANATE AND BARIUM STRONTIUM TITANATE

(75) Inventors: Chen Tsan Ying; Jeng H. Hwang, both of Cupertino, CA (US); Hideyuki Yamauchi, Chiba (JP); Seayoul Park, Chiba (JP); Yohei Kawase, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/556,078

(22) Filed: Apr. 21, 2000

(51) Int. Cl.$^7$ ............................................. H01L 21/302
(52) U.S. Cl. ...................... 438/710; 438/210; 438/296; 438/396; 438/397; 438/398
(58) Field of Search ................................ 438/710, 296, 438/210, 397, 396, 398

(56) References Cited

U.S. PATENT DOCUMENTS

| 5,186,718 A | 2/1993 | Tepman et al. ............. 29/25.01 |
| 5,658,820 A | 8/1997 | Chung ........................... 438/3 |

(List continued on next page.)

FOREIGN PATENT DOCUMENTS

| EP | 0786805 | 7/1997 | ......... H01L/21/321 |
| EP | 0795896 | 9/1997 | ......... H01L/21/311 |
| EP | 0907203 | 4/1999 | ......... H01L/21/311 |
| EP | 0984490 | 3/2000 | ....... H01L/21/8242 |
| JP | 8222238 | 3/1998 | ......... H01L/21/768 |
| JP | 9049526 | 9/1998 | ......... H01L/27/108 |
| JP | 11121696 | 4/1999 | ........... H01L/27/04 |
| JP | 11307735 | 11/1999 | ......... H01L/27/108 |
| WO | WO 0049649 | 8/2000 | ....... H01L/21/3213 |

OTHER PUBLICATIONS

T. An, "Effects of BCl$_3$ addition on Ar/Cl$_2$ gas in inductively coupled plasmas for lead zirconium titanate etching", *J. Vac. Sci. Technol.* A, 18(4), pp. 1373–1376 (Jul./Aug. 2000).

N. Ikegami et al., "Dry–Etching Mechanism of Sputtered Pb(Zr$_{1-x}$Ti$_x$)O$_3$ Film", *Jpn. J. Appl. Phys.*, vol. 35, pp. 2505–2511 (1996).

(List continued on next page.)

*Primary Examiner*—Richard Elms
*Assistant Examiner*—Pho M. Luy
(74) *Attorney, Agent, or Firm*—Shirley L. Church; Kathi Bean; Joseph Bach

(57) ABSTRACT

In an embodiment of the present invention, a method is provided of patterning PZT layers or BST layers. For example, a PZT layer or a BST layer is plasma etched through a high-temperature-compatible mask such as a titanium nitride (TiN) mask, using a plasma feed gas comprising as a primary etchant boron trichloride (BCl$_3$) or silicon tetrachloride (SiCl$_4$). Although BCl$_3$ or SiCl$_4$ may be used alone as the etchant plasma source gas, it is typically used in combination with an essentially inert gas. Preferably the essentially inert gas is argon. Other potential essentially inert gases which may be used include xenon, krypton, and helium. In some instances O$_2$ or N$_2$, or Cl$_2$, or a combination thereof may be added to the primary etchant to increase the etch rate of PZT or BST relative to adjacent materials, such as the high-temperature-compatible masking material. A TiN masking material can easily be removed without damaging underlying oxides. The selectivity of PZT or BST relative to TiN is very good, with the ratio of the etch rate of the PZT film to the etch rate of the TiN mask typically being better than 20:1. In addition, the etch rate for PZT using a BCl$_3$—comprising plasma source gas is typically in excess of 2,000 Å per minute. A substrate bias power is applied to direct ions produced from the BCl$_3$ or SiCl$_4$ toward the surface to be etched. The bias power is controlled to avoid sputtering of a conductive layer or layers in contact with the PZT layer, so that the surface of the etched PZT is not contaminated by a conductive material, which can cause the semiconductor device which includes the patterned PZT to short out.

35 Claims, 1 Drawing Sheet

U.S. PATENT DOCUMENTS

| | | | | |
|---|---|---|---|---|
| 5,731,608 A | | 3/1998 | Hsu et al. | 257/295 |
| 5,786,259 A | | 7/1998 | Kang | 438/396 |
| 5,854,104 A | * | 12/1998 | Onishi et al. | 438/240 |
| 5,953,619 A | * | 9/1999 | Miyazawa et al. | 438/396 |
| 6,100,201 A | | 8/2000 | Maejima et al. | 438/706 |
| 6,211,035 B1 | * | 4/2001 | Moise et al. | 438/396 |
| 6,265,318 B1 | * | 7/2001 | Hwang et al. | 438/720 |

OTHER PUBLICATIONS

S. Kim et al., "Etching mechanism of (Ba,Sr)TiO$_3$ films in high density Cl$_2$/BCl$_3$/Ar plasma", *J. Vac. Sci. Technol. A*, 18(4), pp. 1381–1384 (Jul./Aug. 2000).

Copy of Search Report in corresponding PCT Application No. PCT/US0112905, mailed Nov. 11, 2001.

B. Charlet et al., "Dry Etching of PZT Films in an ECR Plasma", *Mat. Res. Soc. Symp. Proc.*, vol. 310, pp. 363–368 (1993).

C. Chung et al., "Investigation of Etch Profiles in Etching of PZT and Pt Thin Films", *Mat. Res. Soc. Symp. Proc*, vol. 493, pp. 119–129.

M. Hendrickson et al., "Processing PZT Piezoelectric Thin Films for Microelectromechanical Systems", *Proceedings of the Tenth IEEE International Symposium on the Applications of Ferroelectrics*, vol. II, pp. 683–686 (1996).

F. Hintermaier et al., "Properties of SrBi$_2$Ta$_2$O$_9$ Thin Films Grown by MOCVD for High Density FeRAM Applications", *1998 Symposium on VLSI Technology Digest of Technical Papers*, pp. 56–57 (1998).

W. Lee et al., "Etching Behavior and Damage Recovery of SrBi$_2$Ta$_2$O$_9$ Films",*Jap.J.Appl.Physics*, vol. 38, No. 12A, pp. L1428–L1431 (1999).

H. Macé et al., "Reactive ion etching of Pt/PZT/Pt ferroelectric thin film capacitors in high density DECR plasma", *Microelectronic Engineering*, vol. 29, pp. 45–48 (1995).

S. S. Park et al., "Effect of Plasma–Induced Charging in Interconnect Metal Etch on the Characteristics of a Ferroelectric Capacitor", *J. Korean Physical Soc.*, vol. 35, pp. S742–S746 (1999).

S. S. Park et al., "Coercive voltage Shift of a Ferroelectric Capacitor during Interconnect Metal Etch", *The Institute of Electronics, Information and Communication Engineers*, vol. 99, No. 230 (ED99–113–144), pp. 39–44 (1999).

Y. Ye et al., "0.35–Miron and Sub–0.35–Micron Metal Stack Etch in a DPS Chamber—DPS Champer and Process Characterization", *Electrochemical Society Proceedings*, vol. 96–12, pp. 222–233 (1996).

* cited by examiner

METHOD OF PATTERNING LEAD ZIRCONIUM TITANATE AND BARIUM STRONTIUM TITANATE

BACKGROUND OF THE INVENTION

1. Field of the Invention

The present invention pertains to dynamic and nonvolatile random access memory devices, infrared sensor, and electro-optical devices, for example, which are formed from ferroelectric thin films. In particular, the invention relates to a method of patterning a lead zirconium titanate ferroelectric film, as well as electrode materials which may be in contact with the ferroelectric film.

2. Brief Description of the Background Art

Ferroelectric materials belong to a class of crystals whose low symmetry engenders a spontaneous polarization along one or more crystal axes. Ferroelectric crystals are characterized by having polarization vectors that can be oriented in two diametrically opposite directions by applying an external electric field. The polarization states in a ferroelectric crystal are due to displacements of positive metallic and negative oxygen ions in different directions. Thermodynamically stable, these states can be switched from one to the other by applying an external electric field known as the coercive field $E_c$. The ability of ferroelectric materials to switch their polarization direction between two stable polarized states provides the basis for the binary code-based nonvolatile ferroelectric random-access memories (NVFRAMs).

Some ferroelectric materials, for example $Pb(Zr_xTi_{1-x})O_3$ (lead zirconium titanate (PZT) are transformed from a ferroelectric (low temperature) phase to a nonferroelectric (high temperature) phase at the "Curie temperature" (about 670° K. for PZT). Other ferroelectric materials, such as Ba $MgF_4$, for example, do not exhibit such a phase transition, even up to their melting points. In addition, ferroelectric materials typically exhibit polarization hysteresis.

Ferroelectric materials in addition to the two mentioned above, which are being developed for use in various devices include, but are not limited to SBT (Sr $Bi_2$ $Ta_2$ $O_9$); SBTN (Sr $Bi_2$ $(Ta_{1-x}Nb_x)_2$ $O_9$; and BST ($Ba_xSr_{1-x}Ti$ $O_3$).

One ferroelectric semiconductor device of particular interest is a ferroelectric capacitor, which typically comprises a ferroelectric material sandwiched between electrodes. Examples might be a Pt/PZT/Pt capacitor or an Ir/PZT/Ir capacitor, not by way of limitation. Patterning of various semiconductor substrate layers to produce a ferroelectric device such as a capacitor is of particular interest for the next generation of personal computers, since computers based on NVFRAMS will not require backup disk memories. It is very likely such computers will have no moving parts and be smaller and far more robust than today's personal computers.

In their paper entitled "Investigation of Etch Profiles in Etching of PZT and Pt Thin Films, Chee Won Chung et al. describe the reactive ion etching of $PbZr_xTi_{1-x}O_3$ (PZT) and Pt thin films using chlorine and fluorine gas chemistry in an Inductively Coupled Plasma. (Mat. Res. Soc. Symp. Proc. Vol. 493, pp. 119–129.) The etch chemistry originally used for etching the PZT film layer was based on a plasma source gas of $Cl_2/C_2F_6$/Ar. The ratio of $Cl_2$ to $C_2F_6$ was fixed at 9:1, and the concentration of $Cl_2+C_2F_6$ in the $Cl_2/C_2F_6$/Ar mixture being less than 40% of the volume of gas flow, preferably 30%. The etch chemistry originally used for etching Pt films was based on a plasma source gas of $Cl_2$/Ar. It was determined that a $PtCl_2$ etch byproduct redeposited on etched surfaces and a new etch chemistry for Pt films based on a plasma source gas of $SiCl_4/Cl_2$/Ar was recommended.

In another paper related to the etching of PZT, titled "Dry Etching of PZT Films In An ECR Plasma", Barbara Charlet et al., Mat. Res. Soc. Symp. Proc. Vol. 310, 1993, pp. 363–368, the etching of PZT relative to silicon, silicon dioxide and platinum is described. Plasma etching using plasma etchants comprising $SF_6$ in combination with $Cl_2$, or $SF_6$ in combination with HBr, each combination compared with argon as an etchant, is described in detail. Additional information pertaining to plasma etching of PZT may be found in an article entitled "Reactive ion etching of Pt/PZT/Pt ferroelectric thin film capacitors in high density DECR plasma" by H. Mace et al, Microelectronic Engineering, Vol. 29, 1995, pp. 45–48. In particular, plasma etching using $CF_4$, or $CF_4/Cl_2$, or $Cl_2$, or argon is described in detail. Further description of plasma etching of PZT using a $Cl_2/CCl_4$ etchant mixture is described in an article entitled "Processing of PZT Piezoelectric Thin Films for Microelectromechanical Systems" by Mary Hendrickson et al., Proceedings of the Tenth IEEE International Symposium on the Applications of Ferroelectrics, Aug. 18–21, 1966, Volume II, pp. 363–368. All of the above-listed articles pertaining to the plasma etching of PZT are hereby incorporated by reference.

BST ($Ba_xSr_{1-x}Ti$ $O_3$) is typically used in the formation of dynamic random access memories (DRAMS), where the thickness of the BST layer is a few hundred Angstroms, typically in the range of 200 Å–300 Å, for example. In this particular application, the BST is used more for its dielectric properties (relatively high dielectric constant) than for its ferroelectric properties. A description of the use of PZT and BST in the fabrication of DRAMS and ferroelectric random access memories (FRAMS) is provided in U.S. Pat. No. 5,786,259 to Chang-seok Kang, issued Jul. 28, 1998. The Kang patent recommends that the PZT or BST layer be etched using a chemical-mechanical-polishing step or an "etch back" step which is not described.

SUMMARY OF THE INVENTION

A method of plasma etching PZT or BST layers is disclosed herein. The method comprises the steps of: (a) patterning a layer of high-temperature-compatible masking material, where said masking material overlies the PZT or BST layer; and (b) transferring a pattern from the patterned masking layer through at least a portion of the PZT layer or the BST layer by plasma etching the PZT layer or the BST layer through the patterned masking layer using a plasma generated from a plasma feed gas where the principal chemical etchant source is $BCl_3$, $SiCl_4$, or a combination thereof. Depending on the masking material, there are some instances when it is desirable to avoid or restrict the addition of $Cl_2$ gas to the plasma feed gas. Preferred high-temperature-compatible masking materials, by way of example and not limitation, include TaN, TiN, $WN_2$, Ti, $TiO_2$, $SiO_2$, or combinations thereof.

The method may be used to produce a plasma etched semiconductor structure including a ferroelectric capacitor, the capacitor comprising: an upper electrode layer, a PZT or BST dielectric layer, and a lower electrode layer, where the capacitor has a feature size of less than 0.25 μm, and a sidewall angle ranging between about 85° and 90°.

BRIEF DESCRIPTION OF THE DRAWINGS

FIG. 1A represents the center wafer area of the etched substrate and FIG. 1B represents the edge wafer area of the etched substrate.

FIGS. 2A and 2B illustrate views of the center wafer area of the etched substrate and the edge area of the etched substrate, respectively, after an etch period of about 73 seconds.

DETAILED DESCRIPTION OF THE PREFERRED EMBODIMENTS

Figure 1A:
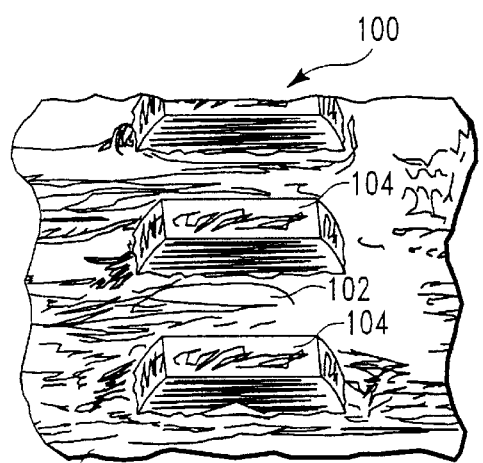
FIGS. 1A and 1B show schematics illustrating a photomicrograph of a semiconductor structure 100, where attempts to etch a PZT layer 102 using a TiN mask 104 in combination with a Cl$_2$/Ar/O$_2$ plasma source gas provided negligible etching after a 233 second etch period.

Due to the many potential applications for patterned PZT or BST films, we initiated programs to develop a method for plasma etching of such films. In an embodiment of the present invention, a method is provided for patterning PZT layers or BST layers. In particular, a PZT or BST layer is plasma etched through a high-temperature-compatible (frequently, but not necessarily inorganic) masking material. Preferably, the masking material does not contain oxygen. Examples of inorganic masking materials include titanium nitride (TiN), tantalum nitride (TaN), tungsten nitride (WN$_2$), titanium (Ti), titanium oxide (TiO$_2$), and silicon oxide (SiO$_2$), by way of example, and not by way of limitation. Preferably the hard masking material is TiN. The plasma etchant species are generated from a plasma source (feed) gas comprising boron trichloride (BCl$_3$) or silicon tetrachloride (SiCl$_4$), or a combination thereof. The BCl$_3$ or SiCl$_4$ principal chemical etchants are frequently used in combination with argon, oxygen, nitrogen, chlorine, or a combination thereof. When the high-temperature-compatible masking material comprises a metal which is susceptible to a significant increase in etch rate when exposed to reactive species generated from a chlorine-comprising plasma geed gas, presence of chlorine in the feed gas should be avoided. The oxygen or nitrogen or chlorine may be added to improve selectivity in favor of etching PZT or BST relative to other adjacent materials. Other essentially inert gases may be added, for example and not by way of limitation, xenon, krypton, or helium. Such essentially inert gases may be used in place of or in combination with argon, with the quantity adjusted to compensate for functional differences.

A substrate bias power is applied to direct ions produced from the BCl$_3$ or SiCl$_4$ toward the surface to be etched. The bias power is controlled to avoid sputtering of a conductive layer or layers in contact with the PZT layer or the BST layer, so that the surface of the etched PZT or BST is not contaminated by a conductive material, which can cause the semiconductor device which includes the patterned PZT or BST to short out.

Although the equipment used to carry out the etching processes described herein was a decoupled plasma source Centura® Integrated Processing System, other kinds of etch processing equipment where the plasma is generated through inductive coupling or capacitive coupling or resonant coupling, or combinations thereof may be used as well. Use of equipment which provides a high density plasma is preferred. The term "high density plasma" typically refers to, but is not limited to, a plasma having an electron density of at least $5 \times 10^{10}$ e$^{-/cm3}$.

Some examples of process equipment which may be used include: A process chamber having an internal device located above the substrate surface, which device assists in plasma generation through inductive coupling; a process chamber which is supplied with a plasma from a remotely-generated source; a process chamber having a device located external to the chamber which assists in plasma generation through inductive coupling; and a process chamber which utilizes a parallel plate device which assists in plasma generation through capacitive coupling.

The CENTURA® Integrated Processing System in which the etch processes described below were carried out is available from Applied Materials, Inc. of Santa Clara, Calif. The system is shown and described in U.S. Pat. No. 5,186,718, the disclosure of which is hereby incorporated by reference. This equipment included a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96–12, pp. 222–233 (1996). The plasma processing chamber enables the processing of an 8 inch (200 mm) diameter silicon wafer.

Use of a high density plasma in a DPS etching system provides the advantage of separate control of ion density and ion energy. This can be used to provide higher selectivity, reduce substrate damage, and reduce the occurrence of microloading. The term "etch selectivity" as used herein is typically used to refer to a) a ratio of etch rates of two materials; or b) a condition achieved during etch when etch rate of one material is increased in comparison with another material.

Figure 1B:
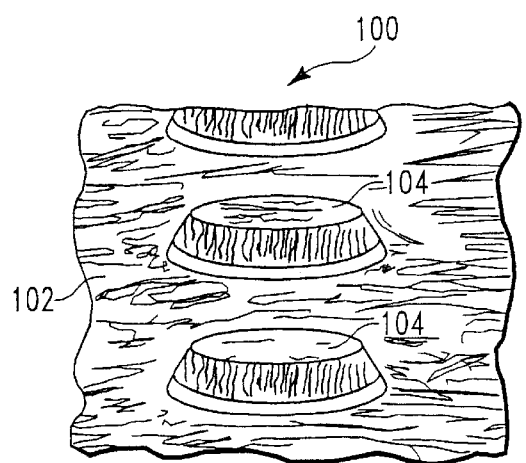

In order to obtain good etch selectivity, so that a PZT layer or BST layer would etch rapidly compared to the material of the patterned masking layer, we decided to use a high-temperature-compatible masking layer capable of performing at a temperature of 120° C. or higher. Preferably, the masking material would not contain oxygen, such as a titanium nitride (TiN) masking layer. We selected a plasma source gas comprising Cl$_2$/Ar/O$_2$, since oxygen-comprising source gases were known to provide good selectivity when used with a TiN masking layer. Attempts to etch a PZT layer 102 using a TiN mask in combination with a Cl$_2$/Ar/O$_2$ plasma source gas provided negligible etching after a 233 second etch period. The etch process provided a product which is illustrated in FIGS. 1A and 1B. FIG. 1A shows the center wafer area of the etched substrate and FIG. 1B shows the edge wafer area.

In view of the failure of the plasma generated from the Cl$_2$/Ar/O$_2$ plasma source gas to etch the PZT layer 102, we began searching for another combination of gases which was capable of etching PZT while still providing selectivity relative to a TiN masking layer.

As a preface to the detailed description of the preferred embodiments, it should be noted that, as used in this specification and the appended claims, the singular forms "a", "an", and "the" include plural referents, unless the context clearly dictates otherwise. Thus, for example, "a semiconductor" includes a variety of different materials which are known to have the behavioral characteristics of a semiconductor, reference to "a conductive material" includes aluminum, aluminum alloys, copper, copper alloys, platinum, platinum alloys, iridium, iridium oxide, iridium alloys, tungsten, tungsten alloys, ruthenium, ruthenium oxide, combinations thereof, and other conductive materials which would be suitable in the application described.

EXAMPLE ONE

Figure 2A:
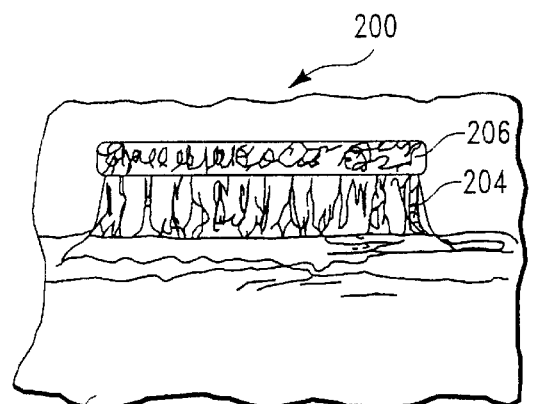
FIGS. 2A and 2B show schematics illustrating a photomicrograph of an etched semiconductor structure 200, formed using the present invention, where a TiN masking layer 206 was used to pattern a PZT layer 204, which is shown extending above an underlying platinum layer 202.
Figure 2B:
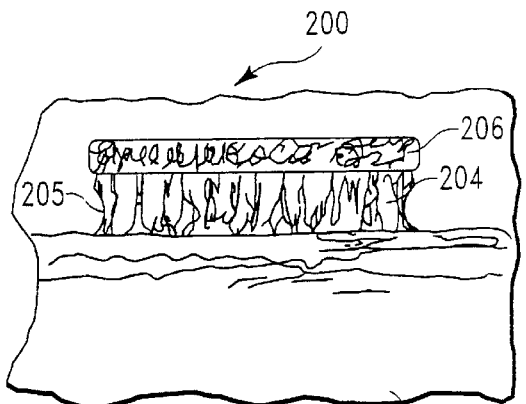

FIGS. 2A and 2B show schematics illustrating a photomicrograph of an etched semiconductor structure 200, formed using the present invention, where a TiN masking layer 206 was used to pattern a PZT layer 204, which is shown extending above an underlying platinum layer 202. FIGS. 2A and 2B illustrate two different views, showing the center wafer area of the etched substrate and the edge wafer area of the etched substrate, respectively, after an etch period of about 73 seconds.

In particular, the initial etch stack prior to patterning included, from etch stack top toward underlying substrate: a 1,500 Å thick layer of TiN; a 2,000 Å thick layer of PZT; a 1,500 Å thick layer of Pt; a 300 Å thick layer of $TiO_2$; a 1,000 Å thick layer of SiOx; and a silicon substrate. The pattern etched was a series of dots varying in size from about 1.0 μm in diameter to about 1.5 μm in diameter, with the typical spacing between the dots of about 1.0 μm to about 1.5 μm or greater.

The TiN masking layer, shown after patterning as layer 206 in FIGS. 2A-1, 2A-2, 2B-1, and 2B-2, was patterned using an overlying patterned I-line photoresist layer, which was applied and patterned using techniques known in the art. The TiN masking layer was patterned using an etchant plasma generated from a plasma source gas comprising $Cl_2$ at 90 sccm and $BCl_3$ at 30 sccm. The TiN masking layer may also be etched using $Cl_2$ and argon at approximately the same gas flow rates to the etch chamber described herein. The pressure in the etch chamber was 15 mTorr. The plasma source power was 1400 W at a frequency of 2 MHZ; the substrate bias power was 75 W at a frequency of 13.56 MHZ; the helium back pressure against the backside of the substrate wafer (for cooling purposes) was 7 Torr; the temperature of the cathode upon which the substrate rested was about 45° C. (which typically results in a substrate temperature about 20° C. higher than the cathode temperature). Subsequently, the photoresist was removed using techniques known in the art. Preferably the photoresist is removed using an apparatus separate from the etch chamber in which the PZT dielectric and conductive electrodes are etched, to avoid contamination of the etch chamber.

The pattern was transferred from TiN layer 206 through underlying PZT layer 204 using the following etch process conditions. The plasma source gas was 40 sccm of $BCl_3$ combined with 90 sccm of Ar. The pressure in the etch chamber was 15 mTorr; the plasma source power was 1,500 W; the substrate bias power was 150 W; the helium backpressure on the backside of the wafer substrate was 3 Torr; and the temperature of the cathode upon which the substrate rested was 310° C. The etch time required to transfer the pattern (etch) through 2,000 Å of PZT was about 48 seconds.

Subsequent to pattern transfer, the PZT layer was overetched slightly. In this particular description, the term "overetch" does not mean etching into the layer underlying the PZT layer; "overetch" is used to clean off residual PZT remaining on the surface of the underlying layer which is exposed upon pattern etching of the PZT layer. The overetch process conditions were as follows. The plasma source gas was 40 sccm of $BCl_3$ combined with 90 sccm of Ar. The pressure in the etch chamber was 7 mTorr; the plasma source power was 700 W; the substrate bias power was 75 W; the helium backpressure on the backside of the wafer substrate was 3 Torr; and the temperature of the cathode upon which the substrate rested was 310° C. The overetch time was about 25 seconds.

The etched pattern is illustrated in FIGS. 2A and 2B, as described above. A comparison of the etch profile of the etched PZT from the center of the wafer substrate (as shown in FIG. 2A) with the etch profile of the etched PZT from the edge of the wafer (as shown in FIG. 2B) shows a more aggressive PZT etch at the edge of the wafer, resulting in a slight undercut in the etch profile, as indicated at 205 in FIG. 2B. However, one skilled in the art can provide a more uniform etching over the entire surface of the substrate by re-directing the plasma to accommodate particular geometries of the etch apparatus.

EXAMPLE TWO

Figure 3:
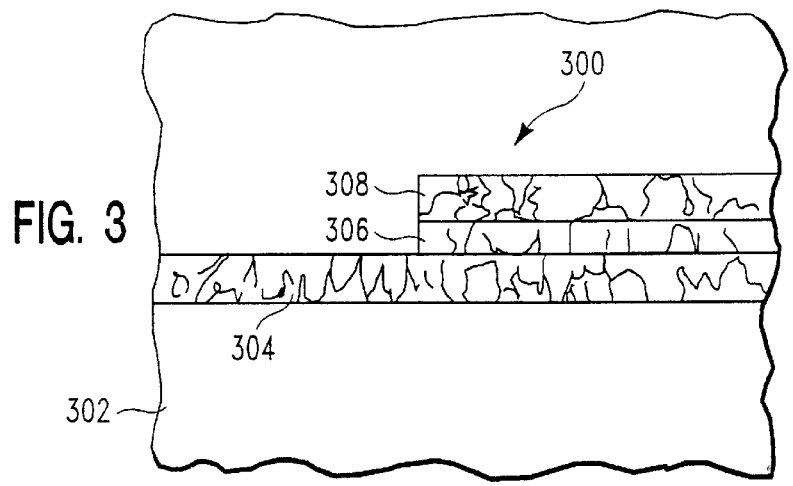
FIG. 3 shows a schematic illustrating a photomicrograph of an etched semiconductor structure 300, formed using the present invention, where a TiN masking layer (not shown) was used to pattern an upper electrode layer 308 of Ir, and an underlying dielectric layer 306 of PZT, both of which were overlying a lower electrode layer 304 of Ir and a substrate layer 302 of SiOx.

FIG. 3 shows a schematic illustrating a photomicrograph of an etched semiconductor structure 300, formed using the present invention. The etch stack prior to patterning included, from top of the etch stack toward the underlying substrate: an I-line photoresist having a thickness of 1.0 μm (not shown); a masking layer of TiN having a thickness of 1,000 Å (not shown); an upper electrode layer 308 of Ir having a thickness of 1,000 Å; an interlayer 306 of PZT dielectric having a thickness of 1,500 Å; a lower electrode layer 304 of Ir having a thickness of 1,000 Å; and an underlying substrate 302 of SiOx. In this instance, the patterned TiN masking layer (not shown), which was used to transfer the pattern through a portion of capacitor structure including an upper electrode layer 308 of Ir, and interlayer 306 of PZT dielectric, both of which were overlying a lower electrode layer 304 of Ir.

The photoresist patterning was done using methods described in the art. The TiN masking layer patterning was done in the manner described above with reference to Example One. Subsequently, the photoresist layer was removed using techniques commonly used in the art.

The pattern transfer (etching) through the upper Ir electrode layer 308 and interlayer 306 of PZT dielectric was done in the manner described below.

The 1,000 Å thick upper electrode Ir layer 308 was plasma etched through the TiN masking layer (not shown) using the following etch process conditions. The plasma source (feed) gas was 15 sccm of $Cl_2$ combined with 20 sccm of $O_2$. The pressure in the etch chamber was 2 mTorr; the plasma source power was 1,500 W; the substrate bias power was 750 W; the helium backpressure on the backside of the wafer substrate was 3 Torr; and the temperature of the cathode upon which the substrate rested was 310° C. The etch time required to transfer the pattern through a 1,000 Å thick layer of Ir was about 30 seconds.

The 1,500 Å thick interlayer 306 of PZT dielectric was plasma etched through the TiN masking layer (not shown) and the upper electrode Ir layer 308 using the following etch process conditions. The plasma source gas was 40 sccm of $BCl_3$ combined with 90 sccm of Ar. The pressure in the etch chamber was 10 mTorr; the plasma source power was 1,500 W; the substrate bias power was 150 W; the helium backpressure on the backside of the wafer substrate was 3 Torr; and the temperature of the cathode upon which the substrate rested was 310° C. The etch time required to transfer the pattern (etch through) 1,500 Å of PZT was about 60 seconds.

After the PZT dielectric layer 306 was etched, the TiN masking layer was removed, using techniques commonly known in the art, to produce the structure shown in FIG. 3.

Although a TiN masking layer was used in the above Examples, other inorganic masking materials such as tantalum nitride (TaN), tungsten nitride ($WN_2$), titanium (Ti), titanium oxide ($TiO_2$) and silicon oxide ($SiO_2$) are expected to perform well, by way of example, and not by way of limitation. Masking layer materials such as the TiN masking material are preferred, because they can easily be removed without damaging underlying oxides. Typically residual TiN masking material may be removed using the plasma etch process described with reference to pattern etching of TiN above; however, it is preferred to use a $Cl_2/Ar$ plasma feed gas. In addition a higher substrate temperature, for example about 300° C. may be used. When the device structure is such that the presence of a conductive material in the areas where residual TiN masking layer remains is not harmful, the residual TiN masking layer may be left in place.

Further, although the conductive electrodes described in the above Examples were either Pt or Ir, conductive electrodes comprising Pt, Ir, Ir $O_2$, Ru, $RuO_2$ or combinations thereof have been determined to perform well and to be easily integrated in the device fabrication process.

In addition, although the plasma used to etch the PZT layer in the examples provided above was generated from a source gas comprising boron trichloride ($BCl_3$) in combination with argon, preliminary data indicates that silicon tetrachloride ($SiCl_4$) may be used as an alternative to or in combination with $BCl_3$. The $SiCl_4$ or $BCl_3$ may be used alone in some instances. Further, at least one other essentially inert gas may be used to replace argon in the source gas mixture, or the other essentially inert gas may be added to a $BCl_3$ and argon mixture. Other essentially inert gases include, for example and not by way of limitation, helium, nitrogen, krypton, and xenon.

As described above, when the principal plasma etchant source is $BCl_3$, the selectivity of PZT to TiN is very good, with an etch rate ratio of the PZT layer to the etch rate of the TiN mask layer of better than 20:1. In addition, the etch rate for PZT using the $BCl_3$ and argon source gas described in the Examples above is typically in excess of 2,000 Å per minute. In the Examples, the volumetric ratio of $BCl_3$:Ar is about 1:2.25. Other volumetric ratios of $BCl_3$:Ar are also useful, depending on the composition of layers of material which are adjacent to the PZT and other process conditions used during the plasma etch. We anticipate that a $BCl_3$:Argon volumetric ratio ranging from about 1:1 to about 1:9 may be used, with a range from about 1:1 to about 1:5 being preferred.

Although not described in these particular examples, we have discovered that very similar etch results may be obtained, with improved selectivity by adding $O_2$, $N_2$, $Cl_2$ or a combination thereof to the plasma feed gas. The device structure determines whether addition of $O_2$, $N_2$, or $Cl_2$ is helpful, depending on the materials adjacent to a PZT or BST layer. Typically, when $O_2$,$N_2$, or $Cl_2$, or a combination thereof is used, the volumetric ratio for these gases ranges from about 0.1 to about 0.5 times the amount of $BCl_3$ or $SiCl_4$.

The etch process conditions may also be adjusted over the following process ranges, depending on the particular device structure being etched. The etch process chamber pressure may range from about 2 mTorr to about 300 mTorr; and the total source gas flow rate to a CENTURA® DPS™ process chamber may range from about 10 sccm to about 400 sccm. The plasma source power may range from about 200 W to about 3,000 W; the substrate bias power may range from about 50 W to about 1,500 W; and, the cathode temperature may range from about 100° C. to about 500° C. A substrate bias power is applied to direct ions produced from the $BCl_3$ and argon toward the surface to be etched. The bias power is controlled to avoid sputtering of a conductive layer or layers in contact with the PZT layer, so that the surface of the etched PZT is not contaminated by a conductive material, which can cause the semiconductor device which includes the patterned PZT to short out. This may be particularly important, for example in a capacitor structure after etching of a first electrode layer and an underlying PZT or BST layer, when the second electrode layer is being etched. The bias power applied to direct ions produced during the etching of the second electrode layer is controlled to reduce or avoid sputtering of the second electrode material, so that the etched surface of the PZT or BST layer is not contaminated by material which is inadvertently sputtered from the second electrode layer. The particular bias power required will be apparatus dependent, but one skilled in the art can determine what the bias power should be using minimal experimentation.

The feature size in the Examples was a circle or dot having a diameter of approximately 1.0 μm or larger, separated by a spacing of about 1.0 μm or larger, as this size feature is easy to probe and test for performance properties. However, one skilled in the art will understand that actual device features will be smaller. For example, in a device, the dot size may be about 0.25 μm or less in diameter, and the shape may not be circular, but may be a rectangle. For these smaller dimensioned features, the etch profile of the sidewall of the etched feature becomes increasingly important. In particular, it becomes important to adjust the process conditions to be able to obtain a sidewall angle of 85° or better (with a 90° angle considered to be advantageous). The sidewall angle referred to is the angle between the sidewall and the base substrate. In many instances it is desirable to have rounded edges at the top and bottom corners of the etched feature. and the etch profile of the sidewalls of the etched dots typically formed an angle with the base substrate of at least 85°, as this makes it possible to locate more device structures over a smaller surface area of the substrate.

A high-temperature-compatible masking material such as TiN can easily be removed without damaging underlying oxides. The selectivity of PZT relative to TiN is very good, using $BCl_3$ or $SiCl_4$ to provide the primary etchant, with an etch rate ratio of PZT film to TiN mask typically being better than 20:1. In addition, the etch rate for PZT using a $BCl_3$—comprising plasma source gas is typically in excess of 2,000 Å per minute. All of these characteristics indicate advantages of using etching method embodiments of the present invention.

The above described embodiments are not intended to limit the scope of the present invention, as one skilled in the art can, in view of the present disclosure expand such embodiments to correspond with the subject matter of the invention claimed below.

We claim:

1. A method of plasma etching PZT layers, comprising the steps of:
   (a) patterning a layer of high-temperature-compatible masking material, where said masking material overlies said PZT layer; and
   (b) transferring a pattern from said patterned masking layer through at least a portion of said PZT layer by plasma etching said PZT layer through said patterned masking layer using a plasma generated from a plasma feed gas where the chemical etchant source consists essentially of $BCl_3$, $SiCl_4$, or a combination thereof.

2. The method of claim 1, wherein said high-temperature-compatible masking material is selected from the group consisting of TaN, TiN, $WN_2$, Ti, $TiO_2$, $SiO_2$ or combinations thereof.

3. The method of claim 2, wherein said masking material is TiN.

4. The method of claim 2, wherein said plasma etching process is carried out at a pressure ranging from about 2 mTorr to about 300 mTorr.

5. The method of claim 4, wherein said plasma etching process is carried out at a temperature of at least 100° C.

6. The method of claim 5, wherein said temperature ranges from 100° C. to about 500° C.

7. The method of claim 6, wherein said temperature ranges from about 150° C. to about 400°.

8. The method of claim 2, wherein said plasma etching process is carried out at a pressure ranging from about 2 mTorr to about 50 mTorr.

9. The method of claim 1, wherein said chemical etchant source is $BCl_3$.

10. The method of claim 1, wherein said plasma feed gas includes an essentially inert gas.

11. The method of claim 10, wherein said etchant source is $BCl_3$.

12. The method of claim 10 or claim 11, wherein said essentially inert gas is selected from the group consisting of argon, helium, xenon, and krypton.

13. The method of claim 12, wherein said essentially inert gas is argon.

14. The method of claim 13, wherein a volumetric ratio of $BCl_3$:Ar ranges from about 1:1 to about 1:9.

15. The method of claim 14, wherein said volumetric ratio of $BCl_3$:Ar ranges from about 1:1 to about 1:5.

16. The method of claim 1 or claim 10, wherein said plasma feed gas includes nitrogen, or chlorine, or a combination thereof.

17. The method of claim 16, wherein the volumetric ratio of said oxygen, or nitrogen, or chlorine, or combination thereof to $BCl_3$ ranges from about 0.1:1 to about 0.5:1.

18. The method of claim 16, wherein the volumetric ratio of said oxygen, or nitrogen, or chlorine, or combination thereof to $SiCl_4$ ranges from about 0.1:1 to about 0.5:1.

19. A method of plasma etching BST layers, comprising the steps of:
(a) patterning a layer of high-temperature-compatible masking material, where said masking material overlies said BST layer; and
(b) transferring a pattern from said patterned masking layer through at least a portion of said BST layer by plasma etching said BST layer through said patterned masking layer using a plasma generated from a plasma feed gas where the principal chemical etchant source is $BCl_3$, $SiCl_4$, or a combination thereof.

20. The method of claim 19, wherein said high-temperature-compatible masking material is selected from the group consisting of TaN, TiN, $WN_2$, Ti, $TiO_2$, $SiO_2$, or combinations thereof.

21. The method of claim 20, wherein said masking material is TiN.

22. The method of claim 19, wherein said principal chemical etchant source is $BCl_3$.

23. The method of claim 19, wherein said plasma feed gas includes an essentially inert gas.

24. The method of claim 23, wherein said principal etchant source is $BCl_3$.

25. The method of claim 23 or claim 24, wherein said essentially inert gas is selected from the group consisting of argon, helium, xenon, and krypton.

26. The method of claim 19 or claim 23, wherein said plasma feed gas includes oxygen, or nitrogen, or chlorine, or a combination thereof.

27. The method of claim 26, wherein the volumetric ratio of said oxygen, or nitrogen, or chlorine, or combination thereof to $BCl_3$ ranges from about 0.1:1 to about 0.5:1.

28. The method of claim 26, wherein the volumetric ratio of said oxygen, or nitrogen, or chlorine, or combination thereof to $SiCl_4$ ranges from about 0.1:1 to about 0.5:1.

29. The method of claim 22, wherein said essentially inert gas is argon.

30. A method of etching a capacitor structure including a layer of PZT and at least one electrode layer of a conductive material, comprising:
(a) patterning a layer of high-temperature-compatible masking material, where said masking material overlies a first electrode layer;
(b) transferring a pattern from said masking material through said first electrode layer using a plasma etching technique; and
(c) transferring said pattern through at least a portion of said PZT layer by plasma etching said PZT layer using a plasma generated from a plasma feed gas where the chemical etchant source consists essentially of $BCl_3$, $SiCl_4$, or a combination thereof.

31. The method of claim 30, including an additional step:
(d) transferring said pattern through a second electrode layer underlying said PZT layer using a plasma etching technique.

32. The method of claim 31, wherein a bias power applied to direct ions produced during said step (d) plasma etching of said second electrode is controlled to reduce or avoid sputtering of said second electrode material, so that an etched surface of said PZT layer is not contaminated by material sputtered from said second electrode layer.

33. A method of etching a capacitor structure including a layer of BST and at least one electrode layer of a conductive material, comprising:
(a) patterning a layer of high-temperature-compatible masking material, where said masking material overlies a first electrode layer;
(b) transferring a pattern from said masking material through said first electrode layer using a plasma etching technique; and
(c) transferring said pattern through at least a portion of said BST layer by plasma etching said BST layer using a plasma generated from a plasma feed gas where the principal chemical etchant source is $BCl_3$, $SiCl_4$, or a combination thereof.

34. The method of claim 33, including an additional step:
(d) transferring said pattern through a second electrode layer underlying said BST layer using a plasma etching technique.

35. The method of claim 34, wherein a bias power applied to direct ions produced during said step (d) plasma etching of said second electrode is controlled to reduce or avoid sputtering of said second electrode material, so that an etched surface of said PZT layer is not contaminated by material sputtered from said second electrode layer.

* * * * *